(12) United States Patent (10) Patent No.: US 8,004,314 B2
Kim (45) Date of Patent: Aug. 23, 2011

(54) SEMICONDUCTOR DEVICE

(75) Inventor: Kwan-Dong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/616,464

(22) Filed: Nov. 11, 2009

(65) Prior Publication Data

US 2011/0001510 A1    Jan. 6, 2011

(30) Foreign Application Priority Data

Jul. 1, 2009   (KR) .......................... 10-2009-0059826

(51) Int. Cl.
*H03K 19/094*    (2006.01)
(52) U.S. Cl. ............. 326/87; 326/30; 326/86; 327/109; 327/112
(58) Field of Classification Search .................... 326/30, 326/82–83, 86–87; 327/108–109, 112
See application file for complete search history.

(56) References Cited

U.S. PATENT DOCUMENTS

| | | | | |
|---|---|---|---|---|
| 4,859,870 A * | 8/1989 | Wong et al. | .................... | 327/108 |
| 5,568,081 A * | 10/1996 | Lui et al. | ........................ | 327/380 |
| 6,051,995 A * | 4/2000 | Pollachek | ........................ | 326/87 |
| 6,420,899 B1 * | 7/2002 | Crittenden et al. | ............. | 326/30 |
| 6,654,310 B2 * | 11/2003 | Nam | ........................ | 365/230.06 |
| 6,664,805 B2 * | 12/2003 | Gonzalez | ........................ | 326/26 |
| 7,053,679 B2 * | 5/2006 | Rho | ............................... | 327/108 |
| 7,170,324 B2 * | 1/2007 | Huber et al. | ................... | 327/170 |
| 7,282,955 B2 * | 10/2007 | Kim | ............................... | 326/87 |
| 7,301,371 B2 * | 11/2007 | Kim | ............................... | 326/82 |
| 7,786,753 B2 * | 8/2010 | Jeong et al. | ..................... | 326/30 |
| 7,821,289 B2 * | 10/2010 | Lee | ............................... | 326/27 |
| 2003/0124989 A1 * | 7/2003 | Kwon | ............................. | 455/88 |
| 2007/0194805 A1 * | 8/2007 | Kim et al. | ........................ | 326/30 |
| 2009/0058474 A1 * | 3/2009 | Kim | ............................... | 327/108 |
| 2009/0168549 A1 * | 7/2009 | Jeon | ......................... | 365/189.05 |
| 2009/0237109 A1 * | 9/2009 | Haig et al. | ..................... | 326/30 |
| 2009/0267637 A1 * | 10/2009 | Park | ............................... | 326/16 |

FOREIGN PATENT DOCUMENTS

KR    1020040048036    6/2004
KR    1020080065100    7/2008

OTHER PUBLICATIONS

Notice of Preliminary Rejection issued from Korean Intellectual Property Office on Dec. 28, 2010.

* cited by examiner

*Primary Examiner* — Jason M Crawford
(74) *Attorney, Agent, or Firm* — IP & T Group LLP

(57) ABSTRACT

A semiconductor device is able to terminate internal transmission lines and including a pre-driving unit configured to generate a pull-up driving signal and a pull-down driving signal corresponding to an output data signal, and transfer the pull-up driving signal and the pull-down driving signal to a first transmission line and a second transmission line, respectively, a main driving unit configured to drive an output data in response to the pull-up driving signal and the pull-down driving signal transferred through the first transmission line and the second transmission line and a termination unit configured to be supplied with a termination voltage to terminate the first transmission line and the second transmission line.

15 Claims, 6 Drawing Sheets

SEMICONDUCTOR DEVICE

CROSS-REFERENCE TO RELATED APPLICATIONS

The present application claims priority of Korean Patent Application No. 10-2009-0059826, filed on Jul. 1, 2009, which is incorporated herein by reference in its entirety.

BACKGROUND OF THE INVENTION

Exemplary embodiments of the present invention relates to a semiconductor design technology, and more particularly, to a technology for terminating internal transmission lines of a semiconductor device.

As semiconductor devices are designed to operate at higher operating frequencies, it is important to ensure a sufficient data window size and timing margin when data is outputted at high speed.

FIG. 1 is a circuit diagram of a conventional semiconductor device.

Referring to FIG. 1, the conventional semiconductor device includes a pre-driving unit 11 and a main driving unit 12.

The pre-driving unit 11 generates a pull-up driving signal PU and a pull-down driving signal PD corresponding to an output data signal DATA_OUT, and transfers the generated pull-up and pull-down driving signals PU and PD to a first transmission line LINE1 and a second transmission line LINE2, respectively. Specifically, a first pre-driving unit PDRV1 generates the pull-up driving signal PU and transfers it to the first transmission line LINE1, and a second pre-driving unit PDRV2 generates the pull-down driving signal PD and transfers it to the second transmission line LINE2.

The main driving unit 12 drives a data input/output pad DQ in response to the pull-up driving signal PU and the pull-down driving signal PD transferred through the first transmission line LINE1 and the second transmission line LINE2. Specifically, a pull-up driving unit MDRV1 or a pull-down driving unit MDRV2 of the main driving unit 12 pulls up or pulls down the data input/output pad DQ to a power supply voltage VDDQ or a ground voltage VSSQ according to the control of the pull-up driving signal PU and the pull-down driving signal PD.

FIG. 2 is a waveform diagram of the pull-up driving signal and the pull-down driving signal in the conventional semiconductor device.

Specifically, FIG. 2 is a waveform diagram of the pull-up driving signal PU and the pull-down driving signal PD that are generated from the pre-driving unit 11 when the output data signal DATA_OUT is "0100101101," and then transferred to the first transmission line LINE1 and the second transmission line LINE2.

Referring to FIG. 2, a first waveform 21 represents a case where data is outputted at low speed while the semiconductor device operates at a relatively low operating frequency of A Hz, and a second waveform 22 represents a case where data is outputted at high speed while the semiconductor device operates at a relatively high operating frequency of 2×A Hz. For reference, the second waveform 22 is a waveform of the pull-up driving signal PU and the pull-down driving signal PD when the operating frequency is two times higher than the first waveform 21.

If the operating frequency becomes high and data is outputted at high speed, 1 unit interval (UI) corresponding to the width of 1 data bit gradually becomes narrower. However, if the 1 UI becomes too narrow, the full swing of the signals cannot be achieved, as illustrated in the second waveform 22. If the full swing of the signals is not achieved during the 1 UI, pattern jitters may be generated. The pattern jitters operate as a factor to reduce an effective window size and timing margin.

SUMMARY OF THE INVENTION

An embodiment of the present invention is directed to providing a semiconductor device which is capable of ensuring the full swing of pull-up and pull-down driving signals by terminating transmission lines for the pull-up and pull-down driving signals, that is, the full swing within a voltage range predetermined by termination.

In accordance with an embodiment of the present invention, a semiconductor device includes a pre-driving unit configured to generate a pull-up driving signal and a pull-down driving signal corresponding to an output data signal, and transfer the pull-up driving signal and the pull-down driving signal to a first transmission line and a second transmission line, respectively; a main driving unit configured to drive an output data to a data input/output pad in response to the pull-up driving signal and the pull-down driving signal transferred through the first transmission line and the second transmission line; and a termination unit configured to be supplied with a termination voltage to terminate the first transmission line and the second transmission line.

In accordance with another embodiment of the present invention, a semiconductor device includes a pre-driving unit configured to generate a pull-up driving signal and a pull-down driving signal corresponding to an output data signal, and transfer the pull-up driving signal and the pull-down driving signal to a first transmission line and a second transmission line, respectively; a main driving unit configured to drive an output data to a data input/output pad in response to the pull-up driving signal and the pull-down driving signal transferred through the first transmission line and the second transmission line; a termination code generation unit configured to generate a termination code in response to a termination enable signal; a first termination driving unit configured to terminate the first transmission line in response to the termination code; and a second termination driving unit configured to terminate the second transmission line in response to the termination code.

DESCRIPTION OF SPECIFIC EMBODIMENTS

Figure 1:
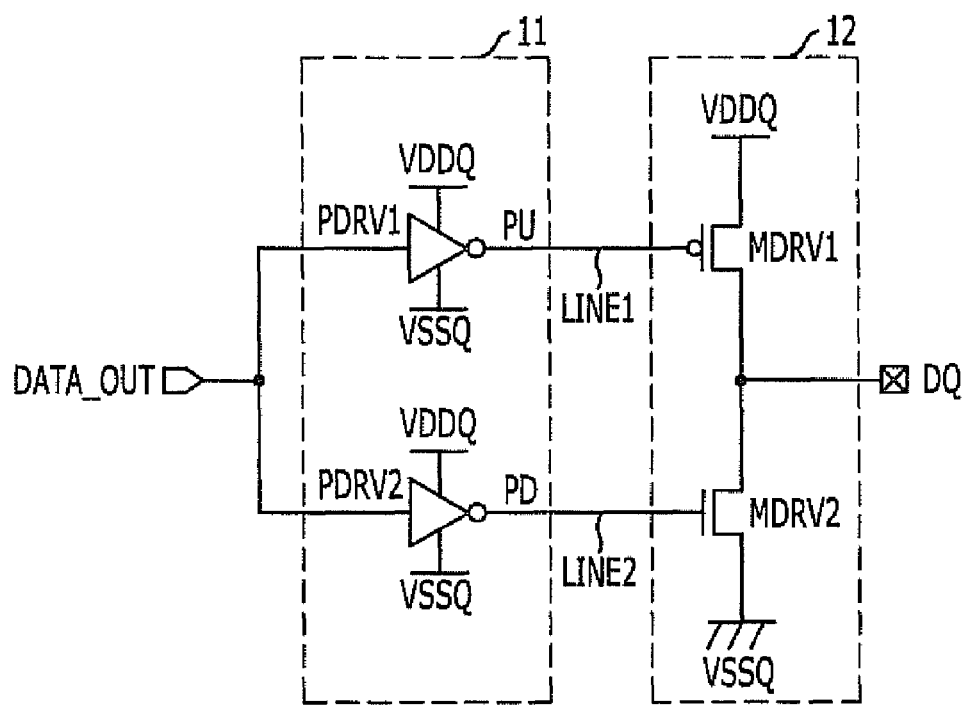
FIG. 1 is a circuit diagram of a conventional semiconductor device.
Figure 2:
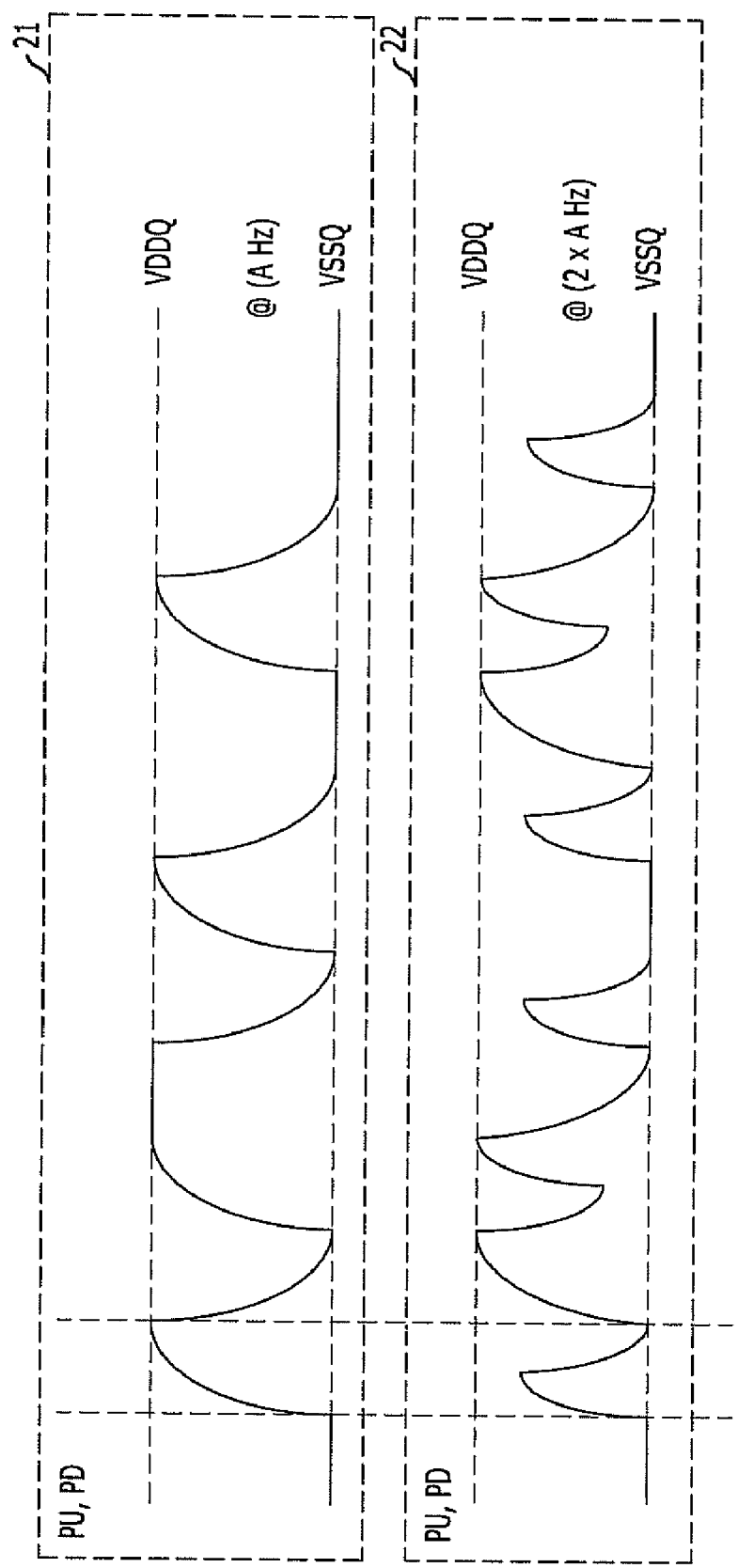
FIG. 2 is a waveform diagram of a pull-up driving signal and a pull-down driving signal in the conventional semiconductor device.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Other objects and advantages of the present invention can be understood by the following description, and become apparent with reference to the embodiments of the present invention. In the drawings and detailed description, since the terms, numerals, and symbols used to indicate devices or blocks may be expressed by sub-units, it should be noted that the same terms, numerals, and symbols may not indicate the same devices in a whole circuit.

Generally, logic signals of a circuit have a high level (H) and a low level (L) according to a voltage level and may be represented by "1" and "0." It will be assumed that, if necessary, the logic signals may have a high impedance (Hi-Z) state. Furthermore, the terms p-channel metal oxide semiconductor (PMOS) and n-channel metal oxide semiconductor (NMOS) used herein are a type of metal oxide semiconductor field effect transistor (MOSFET).

Figure 3:
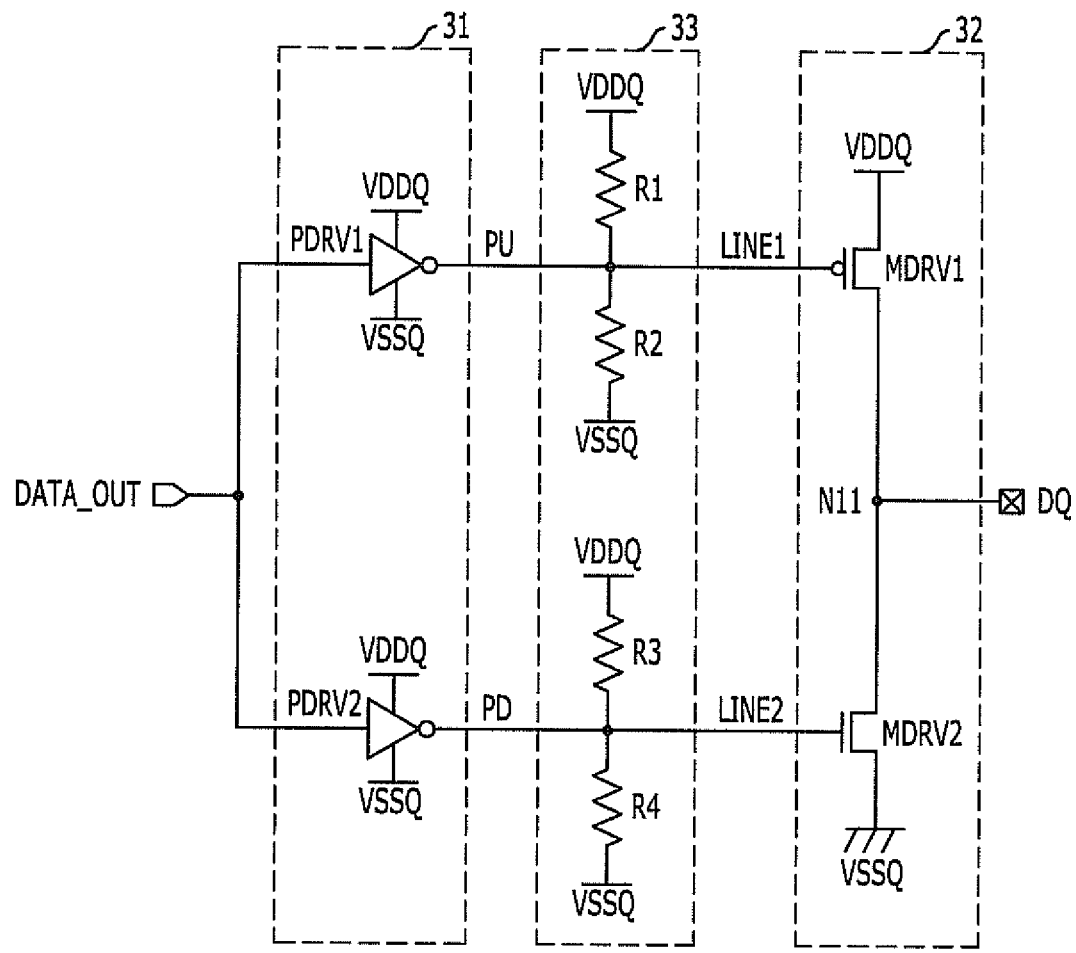
FIG. 3 is a circuit diagram of a semiconductor device in accordance with a first embodiment of the present invention.

FIG. 3 is a circuit diagram of a semiconductor device in accordance with a first embodiment of the present invention.

Referring to FIG. 3, the semiconductor device includes a pre-driving unit 31, a main driving unit 32, and a termination unit 33. The pre-driving unit 31 generates a pull-up driving signal PU and a pull-down driving signal PD corresponding to an output data signal DATA_OUT, and transfers the generated pull-up and pull-down driving signals PU and PD to a first transmission line LINE1 and a second transmission line LINE2, respectively. The main driving unit 32 drives an output data to a data input/output pad DQ in response to the pull-up driving signal PU and the pull-down driving signal PD transferred through the first transmission line LINE1 and the second transmission line LINE2. The termination unit 33 is supplied with termination voltages VDDQ and VSSQ and terminates the first transmission line LINE1 and the second transmission line LINE2.

A detailed structure and principal operation of the above-described semiconductor device will be described below.

The pre-driving unit 31 generates the pull-up driving signal PU and the pull-down driving signal PD corresponding to the output data signal DATA_OUT, and transfers the generated pull-up and pull-down driving signals PU and PD to the first transmission line LINE1 and the second transmission line LINE2. Specifically, a first pre-driving unit PDRV1 generates the pull-up driving signal PU and transfers it to the first transmission line LINE1, and a second pre-driving unit PDRV2 generates the pull-down driving signal PD and transfers it to the second transmission line LINE2.

The main driving unit 32 drives the output data to the data input/output pad DQ in response to the pull-up driving signal PU and the pull-down driving signal PD transferred through the first transmission line LINE1 and the second transmission line LINE2. Specifically, a pull-up driving unit MDRV1 or a pull-down driving unit MDRV2 of the main driving unit 32 pulls up or pulls down the data input/output pad DQ to a power supply voltage VDDQ or a ground voltage VSSQ according to the control of the pull-up driving signal PU and the pull-down driving signal PD. The pull-up driving unit MDRV1 of the main driving unit 32 includes a plurality of PMOS transistors connected in parallel between a power supply voltage (VDDQ) terminal and an output node N11, and the pull-down driving unit MDRV2 includes a plurality of NMOS transistors connected in parallel between a ground voltage (VSSQ) terminal and the output node N11. Furthermore, the main driving unit 32 may include an On Die Termination (ODT) circuit and a drivability controller.

The termination unit 33 includes a first termination load unit R1 connected between the power supply voltage (VDDQ) terminal and the first transmission line LINE1, a second termination load unit R2 connected between the ground voltage (VSSQ) terminal and the first transmission line LINE1, a third termination load unit R3 connected between the power supply voltage (VDDQ) terminal and the second transmission line LINE2, and a fourth termination load unit R4 connected between the ground voltage (VSSQ) terminal and the second transmission line LINE2. In this case, the termination load units R1 to R4 are implemented with resistors that are passive elements.

The termination unit 33 terminates the first transmission line LINE1 and the second transmission line LINE2 to adjust swing widths of the pull-up driving signal PU and the pull-down driving signal PD.

The signal of the first transmission line LINE1 swings around VDDQ/2 due to the first and second termination load units R1 and R2, the power supply voltage VDDQ, and the ground voltage VSSQ. As a result, the signal swing width of the first transmission line LINE1 is determined by a voltage division between an equivalent resistance of the first pre-driving unit PDRV1 and an effective termination resistance. For reference, the signal swing around VDDQ/2 is applied under the assumption that first termination load unit R1 and the second termination load unit R2 are designed to have the same resistance. The swing reference may be adjusted by a resistance ratio and a voltage level of the power supply voltage VDDQ.

The signal of the second transmission line LINE2 swings around VDDQ/2 due to the third and fourth termination load units R3 and R4, the power supply voltage VDDQ, and the ground voltage VSSQ. As a result, the signal swing width of the second transmission line LINE2 is determined by a voltage division between an equivalent resistance of the second pre-driving unit PDRV2 and an effective termination resistance. For reference, the signal swing around VDDQ/2 is applied when it is assumed that the third termination load unit R3 and the fourth termination load unit R4 are designed to have the same resistance. The swing reference may be adjusted by a resistance ratio and a voltage level of the power supply voltage VDDQ.

Consequently, the termination unit 33 performs a control so that the pull-up driving signal PU and the pull-down driving signal PD transferred through the first and second transmission lines LINE1 and LINE2 swing around VDDQ/2. Compared with the case where the termination unit 33 is not provided, the swing widths of the pull-up driving signal PU and the pull-down driving signal PD are reduced. It is more advantageous when a signal having a small swing width operates at high speed. That is, since an operating frequency increases due to the small swing width, conditions advantageous to the full swing (the full swing within a voltage range determined by the termination unit 33 are established even though 1 unit interval (UI) becomes narrow. Therefore, in the current embodiment, the pull-up driving signal PU and the pull-down driving signal PD transferred through the first and second transmission lines LINE1 and LINE2 can ensure the full swing by the termination unit 33 (the full swing within a voltage range determined by the termination unit 33), and thus, the data window size and timing margin when data is outputted at high speed can be ensured sufficiently.

For reference, the full swing widths of the pull-up driving signal PU and the pull-down driving signal PD are in a range from (VDDQ/2)+α to (VDDQ/2)−α, where α is determined by the termination voltages VDDQ and VSSQ and the termination load units R1 to R4. Therefore, even when the operating frequency increases and thus the 1 UI becomes narrow, pattern related jitters are not caused because the pull-up driving signal PU and the pull-down driving signal PD meet their swing levels during the 1 UI. It should be noted that the full swing of the pull-up driving signal PU and the pull-down driving signal PD does not have the swing width of VDDQ to VSSQ because the full swing widths of the pull-up driving signal PU and the pull-down driving signal PD are adjusted by the termination unit 33.

Figure 4:
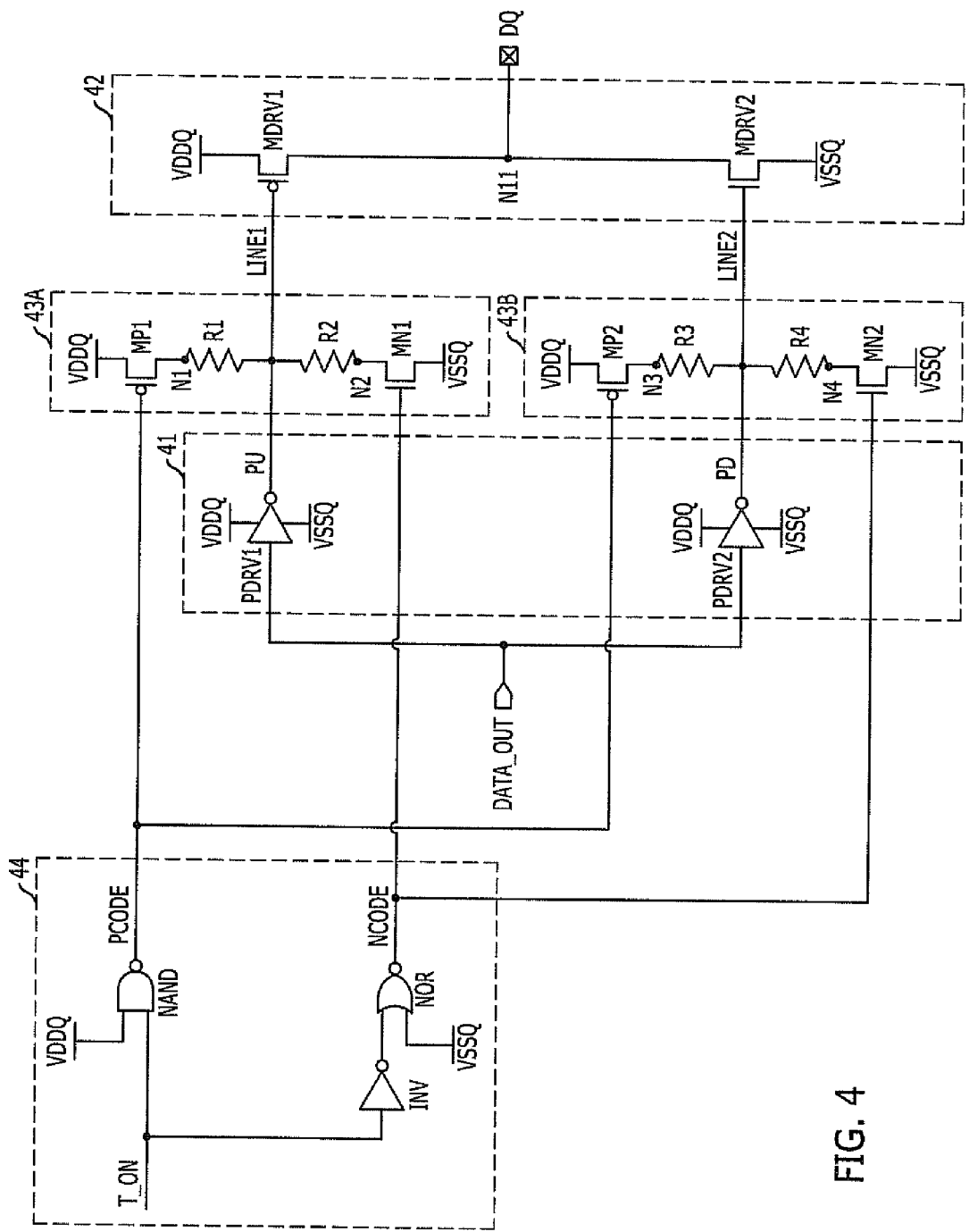
FIG. 4 is a circuit diagram of a semiconductor device in accordance with a second embodiment of the present invention.

FIG. 4 is a circuit diagram of a semiconductor device in accordance with a second embodiment of the present invention.

Referring to FIG. 4, the semiconductor device includes a pre-driving unit 41, a main driving unit 42, a termination code generating unit 44, a first termination driving unit 43A, and a second termination driving unit 43B. The pre-driving unit 41 generates a pull-up driving signal PU and a pull-down driving signal PD corresponding to an output data signal DATA_OUT, and transfers the generated driving signals PU and PD to a first transmission line LINE1 and a second transmission line LINE2, respectively. The main driving unit 42 drives an output data to a data input/output pad DQ in response to the pull-up driving signal PU and the pull-down driving signal PD transferred through the first transmission line LINE1 and the second transmission line LINE2. The termination code generating unit 44 generates termination codes PCODE and NCODE in response to a termination enable signal T_ON. The first termination driving unit 43A terminates the first transmission line LINE1 in response to the termination codes PCODE and NCODE. The second termination driving unit 43B terminates the second transmission line LINE2 in response to the termination codes PCODE and NCODE.

A detailed structure and principal operation of the above-described semiconductor device will be described below.

The pre-driving unit 41 generates the pull-up driving signal PU and the pull-down driving signal PD corresponding to the output data signal DATA_OUT and transfers the generated driving signals PU and PD to the first transmission line LINE1 and the second transmission line LINE2. Specifically, a first pre-driving unit PDRV1 generates the pull-up driving signal PU and transfers it to the first transmission line LINE1, and a second pre-driving unit PDRV2 generates the pull-down driving signal PD and transfers it to the second transmission line LINE2.

In addition, the main driving unit 42 drives the output data to the data input/output pad DQ in response to the pull-up driving signal PU and the pull-down driving signal PD transferred through the first transmission line LINE1 and the second transmission line LINE2. Specifically, a pull-up driving unit MDRV1 or a pull-down driving unit MDRV2 of the main driving unit 42 pulls up or pulls down the data input/output pad DQ to a power supply voltage VDDQ or a ground voltage VSSQ according to the control of the pull-up driving signal PU and the pull-down driving signal PD. The pull-up driving unit MDRV1 of the main driving unit 42 includes a plurality of PMOS transistors connected in parallel between a power supply voltage (VDDQ) terminal and an output node N11, and the pull-down driving unit MDRV2 includes a plurality of NMOS transistors connected in parallel between a ground voltage (VSSQ) terminal and the output node N11. Furthermore, the main driving unit 42 may include an ODT circuit and a drivability controller.

The termination code generating unit 44 includes a first logic unit NAND and a second logic unit NOR. The first logic unit NAND performs a NAND operation on the termination enable signal T_ON and the power supply voltage VDDQ to output the first termination code PCODE. The second logic unit NOR performs a NOR operation on an inversion signal of the termination enable signal T_ON and the ground voltage VSSQ to output the second termination code NCODE. The first logic unit NAND may be implemented with a NAND gate, and the second logic unit NOR may be implemented with a NOR gate.

The first termination driving unit 43A includes a first active load unit MP1, a first termination load unit R1, a second active load unit MN1, and a second termination load unit R2. The first active load unit MP1 is connected between a power supply voltage (VDDQ) terminal and a first node N1 and is controlled by the first termination code PCODE. The first termination load unit R1 is connected between the first node N1 and the first transmission line LINE1. The second active load unit MN1 is connected between the ground voltage (VSSQ) terminal and a second node N2 and is controlled by the second termination code NCODE. The second termination load unit R2 is connected between the second node N2 and the first transmission line LINE1. In this case, the termination load units R1 and R2 are implemented with resistors that are passive elements. The first active load unit MP1 is implemented with a PMOS transistor, and the second active load unit MN1 is implemented with an NMOS transistor.

The second termination driving unit 43B includes a third active load unit MP2, a third termination load unit R3, a fourth active load unit MN2, and a fourth termination load unit R4. The third active load unit MP2 is connected between the power supply voltage (VDDQ) terminal and a third node N3 and is controlled by the first termination code PCODE. The third termination load unit R3 is connected between the third node N3 and the second transmission line LINE2. The fourth active load unit MN2 is connected between the ground voltage (VSSQ) terminal and a fourth node N4 and is controlled by the second termination code NCODE. The fourth termination load unit R4 is connected between the fourth node N4 and the second transmission line LINE2. In this case, the termination load units R3 and R4 are implemented with resistors that are passive elements. The third active load unit MP2 is implemented with a PMOS transistor, and the fourth active load unit MN2 is implemented with an NMOS transistor.

The first termination driving unit 43A terminates the first transmission line LINE1 to adjust the swing width of the pull-up driving signal PU. The signal of the first transmission line LINE1 swings around VDDQ/2 due to the first and second termination load units R1 and R2, the first and second active load units MP1 and MN1, and the termination voltage source VDDQ and VSSQ. As a result, the signal swing width of the first transmission line LINE1 is determined by a voltage division between an equivalent resistance of the first pre-driving unit PDRV1 and an effective termination resistance. For reference, the signal swing around VDDQ/2 is applied when it is assumed that the first termination load unit R1 and the first active load unit MP1 are designed to have the same resistance, and the second termination load unit R2 and the second active load unit MN1 are designed to have the same resistance. The swing reference may be adjusted by a resistance ratio and a voltage level of the termination power source, that is, the power supply voltage VDDQ and the ground voltage VSSQ.

The second termination driving unit 43B terminates the second transmission line LINE2 to adjust the swing width of the pull-down driving signal PD. The signal of the second transmission line LINE2 swings around VDDQ/2 due to the third and fourth termination load units R3 and R4, the third and fourth active load units MP2 and MN2, and the termination voltage source VDDQ and VSSQ. As a result, the signal swing width of the second transmission line LINE2 is determined by a voltage division between an equivalent resistance of the second pre-driving unit PDRV2 and an effective termination resistance. For reference, the signal swing around VDDQ/2 is applied when it is assumed that the third termination load unit R3 and the third active load unit MP2 are designed to have the same resistance, and the fourth termination load unit R4 and the fourth active load unit MN2 are designed to have the same resistance. The swing reference may be adjusted by a resistance ratio and a voltage level of the termination power source, that is, the power supply voltage VDDQ and the ground voltage VSSQ.

Meanwhile, the first termination driving unit 43A and the second termination driving unit 43B terminate the first transmission line LINE1 and the second transmission line LINE2 when the termination enable signal T_ON is activated to a high level. That is, if the semiconductor device is not in a data output state, the termination enable signal T_ON is deactivated to a low level, so that the first termination driving unit 43A and the second termination driving unit 43B are controlled not to terminate the first transmission line LINE1 and the second transmission line LINE2, respectively. This is done for reducing current consumption caused by unnecessary termination operation and preventing malfunctions of the main driving unit 42.

Consequently, the first termination driving unit 43A and the second termination driving unit 43B performs a control so that the pull-up driving signal PU and the pull-down driving signal PD transferred through the first and second transmission lines LINE1 and LINE2 swing around VDDQ/2. Compared with the case where the first termination driving unit 43A and the second termination driving unit 43B are not provided, the swing widths of the pull-up driving signal PU and the pull-down driving signal PD are reduced. It is more advantageous when a signal having a small swing width operates at high speed. That is, since an operating frequency increases due to the small swing width, conditions advantageous to the full swing (the full swing within a voltage range determined by the termination) are established even though 1 UI becomes narrow. Therefore, in the current embodiment, the pull-up driving signal PU and the pull-down driving signal PD transferred through the first and second transmission lines LINE1 and LINE2 can ensure the full swing by the first termination driving unit 43A and the second termination driving unit 43B (the full swing within a voltage range determined by the termination), and thus, the data window size and timing margin when data is outputted at high speed can be ensured sufficiently.

For reference, the full swing widths of the pull-up driving signal PU and the pull-down driving signal PD are in a range from (VDDQ/2)+α to (VDDQ/2)−α, where α is determined by the first termination driving unit 43A and the second termination driving unit 43B. Therefore, even when the operating frequency increases and thus the 1 UI becomes narrow, pattern related jitters are not caused because the pull-up driving signal PU and the pull-down driving signal PD meet their swing levels during the 1 UI. It should be noted that the full swing of the pull-up driving signal PU and the pull-down driving signal PD does not have the swing width of VDDQ to VSSQ because the full swing widths of the pull-up driving signal PU and the pull-down driving signal PD are adjusted by the termination driving unit. Moreover, the termination enable signal T_ON is a signal that is activated to a high level in a data output state. Thus, the termination enable signal T_ON may be generated using an internal signal representing the data output state.

Figure 5:
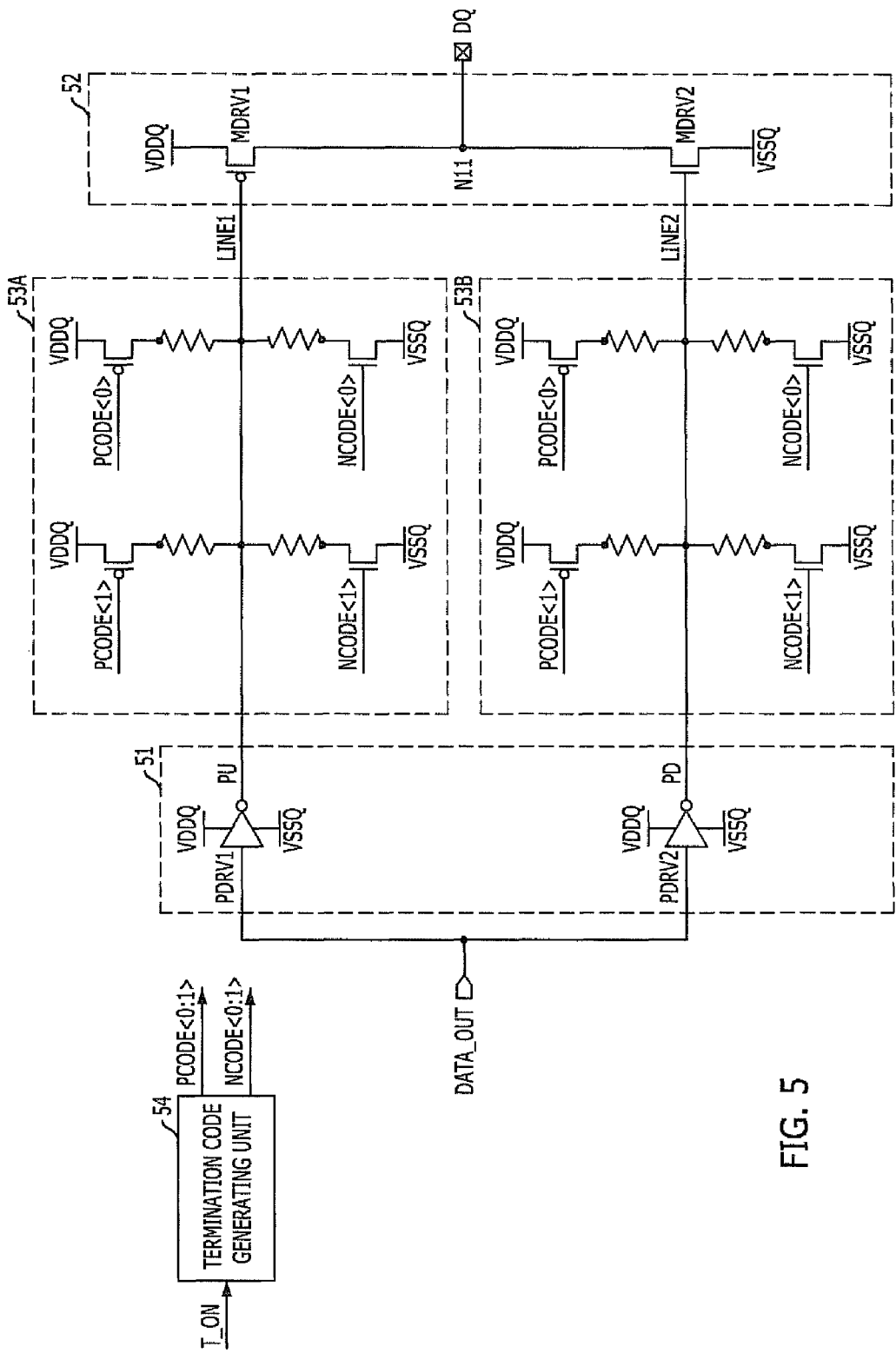
FIG. 5 is a circuit diagram of a semiconductor device in accordance with a third embodiment of the present invention.

FIG. 5 is a circuit diagram of a semiconductor device in accordance with a third embodiment of the present invention.

Referring to FIG. 5, the semiconductor device includes a pre-driving unit 51, a main driving unit 52, a termination code generating unit 54, a first termination driving unit 53A, and a second termination driving unit 53B. The pre-driving unit 51 generates a pull-up driving signal PU and a pull-down driving signal PD corresponding to an output data signal DATA_OUT, and transfers the generated driving signals PU and PD to a first transmission line LINE1 and a second transmission line LINE2, respectively. The main driving unit 52 drives an output data to a data input/output pad DQ in response to the pull-up driving signal PU and the pull-down driving signal PD transferred through the first transmission line LINE1 and the second transmission line LINE2. The termination code generating unit 54 generates termination codes PCODE<0:1> and NCODE<0:1> in response to a termination enable signal T_ON. The first termination driving unit 53A terminates the first transmission line LINE1 in response to the termination codes PCODE<0:1> and NCODE<0:1>. The second termination driving unit 53B terminates the second transmission line LINE2 in response to the termination codes PCODE<0:1> and NCODE<0:1>.

A detailed structure and principal operation of the semiconductor device in accordance with the third embodiment of the present invention are substantially identical to those of the semiconductor device in accordance with the second embodiment of the present invention, except that bit numbers of the termination codes PCODE<0:1> and NCODE<0:1> generated from the termination code generating unit 54 are further added. Therefore, the first termination driving unit 53A and the second termination driving unit 53B can more finely adjust the termination of the first transmission line LINE1 and the second transmission line LINE2 according to the control of the termination codes PCODE<0:1> and NCODE<0:1>. In this embodiment, the termination enable signal T_ON is a signal that is activated to a high level in a data output state. Thus, the termination enable signal T_ON may be generated using an internal signal representing the data output state.

Figure 6:
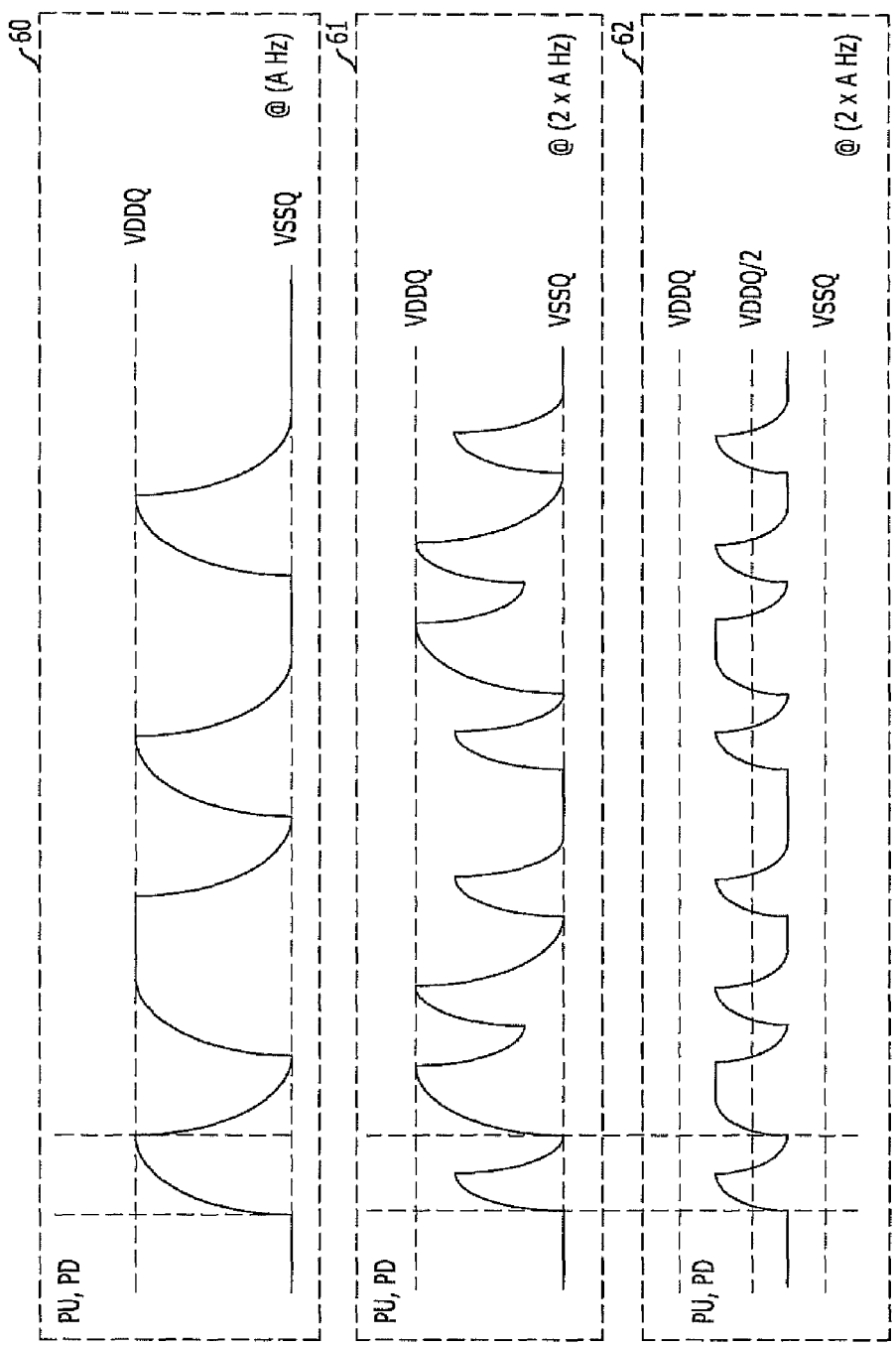
FIG. 6 is a waveform diagram of a pull-up driving signal and a pull-down driving signal in the semiconductor devices in accordance with the embodiments of the present invention.

FIG. 6 is a waveform diagram of the pull-up driving signal and the pull-down driving signal in the semiconductor device in accordance with an embodiment of the present invention.

Specifically, FIG. 6 is a waveform diagram of the pull-up driving signal PU and the pull-down driving signal PD that are generated from the pre-driving unit when the output data signal DATA_OUT is "0100101101," and then transferred to the first transmission line LINE1 and the second transmission line LINE2.

Referring to FIG. 6, a first waveform 60 represents a case where data is outputted at low speed while the semiconductor device operates at a relatively low operating frequency of A Hz, and a second waveform 61 represents a case where data is outputted at high speed while the semiconductor device operates at a relatively high operating frequency of 2×A Hz. The first waveform 60 and the second waveform 61 are waveforms of the semiconductor device to which the present invention is not applied. A third waveform 62 represents a case where data is outputted at high speed while the semiconductor device operates at a relatively high operating frequency of 2×A Hz. The third waveform 62 is a waveform of the semiconductor device to which the present invention is applied.

For reference, the second waveform 61 and the third waveform 62 are the waveforms of the pull-up driving signal PU and the pull-down driving signal PD when the operating frequency is two times higher than the first waveform 60. If the operating frequency becomes high and data is outputted at high speed, 1 unit interval (UI) corresponding to the width of 1 data bit gradually becomes narrower. However, if the 1 UI becomes too narrow, the full swing of the signals may not be achieved.

However, in the semiconductor device in accordance with the embodiments of the present invention, even though the 1 UI corresponding to the width of the 1 data bit gradually becomes narrower when data is outputted at high speed due to the high operating frequency like the third waveform 62, the full swing (full swing within a voltage range determined by the termination) can be achieved, and the sufficient effective window size and timing margin can be ensured.

In accordance with the embodiments of the present invention, the semiconductor device can ensure the full swing of the pull-up driving signal and the pull-down driving signal generated when the data is outputted to the outside (the full swing within the voltage range determined by the termination), thereby ensuring the sufficient data window size and timing margin even though the data is outputted at high speed. That is, it is possible to improve data output characteristic when data is outputted at high speed by the main driver configured to drive the data input/output pad through the control of the pull-up driving signal and the pull-down driving signal.

While the present invention has been described with respect to the specific embodiments, it will be apparent to those skilled in the art that various changes and modifications may be made without departing from the spirit and scope of the invention as defined in the following claims.

For example, although not directly related to the technical spirit of the present invention, embodiments including additional structures may be exemplified for further detailed description. Furthermore, the active high or active low structure representing the activation states of signals or circuits may be changed according to embodiments. Moreover, the configurations of the transistors may also be changed in order to implement the same functions. That is, the PMOS transistor and the NMOS transistor may be exchanged with each other and, if necessary, a variety of transistors may be used herein. Moreover, modifications can be made in the logic gate configurations in order to implement the same functions. That is, NAND units and NOR units may be implemented with various combinations of NAND gates, NOR gates, and inverters. Since numerous modifications may be made in the circuit configuration and may be easily deduced by those skilled in the art, their enumeration will be omitted herein.

What is claimed is:

1. A semiconductor device, comprising:
   a first pre-driving unit configured to generate a pull-up driving signal corresponding to a data signal, and transfer the pull-up driving signal to a first transmission line;
   a second pre-driving unit configured to generate a pull-down driving signal corresponding to the data signal, and transfer the pull-down driving signal to a second transmission line, respectively;
   a first main driving unit configured to drive an output in response to the pull-up driving signal transferred through the first transmission line;
   a second main driving unit configured to drive the output in response to the pull-down driving signal transferred through the second transmission line;
   a termination code generation unit configured to generate a termination code in response to a termination enable signal;
   a first termination driving unit configured to terminate the first transmission line in response to the termination code; and
   a second termination driving unit configured to terminate the second transmission line in response to the termination code,
   wherein the termination code generation unit comprises:
   a first logic unit configured to perform a NAND operation on the termination enable signal and a power supply voltage to output a first termination code; and
   a second logic unit configured to perform a NOR operation on an inverted termination enable signal and a ground voltage to output a second termination code.

2. The semiconductor device of claim 1, wherein the first termination driving unit is configured to terminate the first transmission line to adjust a swing width of the pull-up driving signal transferred through the first transmission line.

3. The semiconductor device of claim 2, wherein the second termination driving unit is configured to terminate the second transmission line to adjust a swing width of the pull-down driving signal transferred through the second transmission line.

4. The semiconductor device of claim 1, wherein the first termination driving unit is configured to terminate the first transmission line to adjust the pull-up driving signal to have a target swing level during 1 unit interval.

5. The semiconductor device of claim 4, wherein the second termination driving unit is configured to terminate the second transmission line to adjust the pull-down driving signal to have a target swing level during 1 unit interval.

6. The semiconductor device of claim 1, wherein the first termination driving unit comprises:
   a first active load unit connected between a power supply voltage terminal and a first node and controlled by the termination code;
   a first termination load unit connected between the first node and the first transmission line;
   a second active load unit connected between a ground voltage terminal and a second node and controlled by the termination code; and
   a second termination load unit connected between the second node and the first transmission line.

7. The semiconductor device of claim 6, wherein the second termination driving unit comprises:
   a third active load unit connected between the power supply voltage terminal and a third node and controlled by the termination code;
   a third termination load unit connected between the third node and the second transmission line;
   a fourth active load unit connected between the ground voltage terminal and a fourth node and controlled by the termination code; and
   a fourth termination load unit connected between the fourth node and the second transmission line.

8. The semiconductor device of claim 1, wherein the first termination driving unit comprises:
   a first active load unit connected between a power supply voltage terminal and a first node and controlled by the first termination code;
   a first termination load unit connected between the first node and the first transmission line;
   a second active load unit connected between a ground voltage terminal and a second node and controlled by the second termination code; and a second termination load unit connected between the second node and the first transmission line.

9. The semiconductor device of claim 8, wherein the second termination driving unit comprises:
   a third active load unit connected between the power supply voltage terminal and a third node and controlled by the first termination code;
   a third termination load unit connected between the third node and the second transmission line;
   a fourth active load unit connected between the ground voltage terminal and a fourth node and controlled by the second termination code; and
   a fourth termination load unit connected between the fourth node and the second transmission line.

10. The semiconductor device of claim 1, wherein the termination enable signal is activated in a data output state.

11. The semiconductor device of claim 1, wherein the termination enable signal is activated in a data output state.

12. A semiconductor device, comprising:
   a pre-driving unit configured to generate a pull-up driving signal and a pull-down driving signal corresponding to a data signal, and transfer the pull-up driving signal and the pull-down driving signal to a first transmission line and a second transmission line, respectively;
   a main driving unit configured to drive an output in response to the pull-up driving signal and the pull-down driving signal transferred through the first transmission line and the second transmission line;
   a termination unit configured to be supplied with a termination voltage to terminate the first transmission line and the second transmission line; and
   a termination code generation unit configured to generate a termination code in response to a termination enable signal;
   wherein the termination code generation unit comprises:
      a first logic unit configured to perform a NAND operation on the termination enable signal and a power supply voltage to output a first termination code; and
      a second logic unit configured to perform a NOR operation on an inverted termination enable signal and a ground voltage to output a second termination code.

13. The semiconductor device of claim 12, wherein the termination unit is configured to terminate the first transmission line and the second transmission line in a data output state to adjust swing widths of the pull-up driving signal and the pull-down driving signal.

14. The semiconductor device of claim 12, wherein the termination unit is configured to terminate the first transmission line and the second transmission line to adjust the pull-up driving signal and the pull-down driving signal to have target swing levels during 1 unit interval.

15. The semiconductor device of claim 12, wherein the termination unit comprises:
   a first termination load unit connected between a power supply voltage terminal and the first transmission line;
   a second termination load unit connected between a ground voltage terminal and the first transmission line;
   a third termination load unit connected between the power supply voltage terminal and the second transmission line; and
   a fourth termination load unit connected between the ground voltage terminal and the second transmission line.

* * * * *